US010090463B2

(12) United States Patent
Lu et al.

(10) Patent No.: US 10,090,463 B2
(45) Date of Patent: Oct. 2, 2018

(54) NON-VOLATILE SOLID STATE RESISTIVE SWITCHING DEVICES

(71) Applicant: The Regents of the University of Michigan, Ann Arbor, MI (US)

(72) Inventors: Wei Lu, Ann Arbor, MI (US); Sung Hyun Jo, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 105 days.

(21) Appl. No.: 13/963,869

(22) Filed: Aug. 9, 2013

(65) Prior Publication Data

US 2013/0328007 A1    Dec. 12, 2013

Related U.S. Application Data

(63) Continuation of application No. 11/875,541, filed on Oct. 19, 2007.

(60) Provisional application No. 60/853,250, filed on Oct. 20, 2006.

(51) Int. Cl.
  *H01L 47/00*  (2006.01)
  *H01L 45/00*  (2006.01)
  *H01L 27/24*  (2006.01)

(52) U.S. Cl.
  CPC .......... *H01L 45/14* (2013.01); *H01L 27/2472* (2013.01); *H01L 27/2481* (2013.01); *H01L 45/085* (2013.01); *H01L 45/1233* (2013.01); *H01L 45/1266* (2013.01); *H01L 45/148* (2013.01); *H01L 45/1616* (2013.01); *H01L 45/1675* (2013.01)

(58) Field of Classification Search
  CPC .................................. H01L 45/1266
  USPC ............................................................ 257/4
  See application file for complete search history.

(56) References Cited

U.S. PATENT DOCUMENTS

| 4,433,468 A | 2/1984 | Kawamata |
| 4,684,972 A | 8/1987 | Owen et al. |
| 5,181,096 A * | 1/1993 | Forouhi ........................ 257/530 |
| 5,242,855 A | 9/1993 | Oguro |
| 5,278,085 A | 1/1994 | Maddox, III et al. |
| 5,315,131 A | 5/1994 | Kishimoto et al. |
| 5,335,219 A | 8/1994 | Ovshinsky et al. |
| 5,360,981 A | 11/1994 | Owen et al. |
| 5,457,649 A | 10/1995 | Eichman et al. |

(Continued)

OTHER PUBLICATIONS

A. Stikeman, Technology Review Sep. 2002, p. 31, "Polymer Memory, The plastic path to better data storage."

(Continued)

*Primary Examiner* — Hsin-Yi Hsieh
(74) *Attorney, Agent, or Firm* — Amin, Turocy & Watson, LLP

(57) ABSTRACT

Non-crystalline silicon non-volatile resistive switching devices include a metal electrode, a non-crystalline silicon layer and a planar doped silicon electrode. An electrical signal applied to the metal electrode drives metal ions from the metal electrode into the non-crystalline silicon layer to form a conducting filament from the metal electrode to the planar doped silicon electrode to alter a resistance of the non-crystalline silicon layer. Another electrical signal applied to the metal electrode removes at least some of the metal ions forming the conducting filament from the non-crystalline silicon layer to further alter the resistance of the non-crystalline silicon layer.

19 Claims, 5 Drawing Sheets

(56) References Cited

U.S. PATENT DOCUMENTS

| | | | |
|---|---|---|---|
| 5,538,564 | A | 7/1996 | Kaschmitter |
| 5,541,869 | A | 7/1996 | Rose et al. |
| 5,714,416 | A | 2/1998 | Eichman et al. |
| 5,856,775 | A * | 1/1999 | Stopper ............... H01L 23/5256 |
| | | | 257/E23.149 |
| 5,970,332 | A | 10/1999 | Pruijmboom et al. |
| 6,128,214 | A | 10/2000 | Kuekes et al. |
| 6,259,116 | B1 | 7/2001 | Shannon |
| 6,291,836 | B1 | 9/2001 | Kramer et al. |
| 6,436,765 | B1 | 8/2002 | Liou et al. |
| 6,436,818 | B1 | 8/2002 | Hu et al. |
| 6,492,694 | B2 | 12/2002 | Noble et al. |
| 6,768,157 | B2 | 7/2004 | Krieger et al. |
| 6,806,526 | B2 | 10/2004 | Krieger et al. |
| 6,815,286 | B2 | 11/2004 | Krieger et al. |
| 6,838,720 | B2 | 1/2005 | Krieger et al. |
| 6,858,481 | B2 | 2/2005 | Krieger et al. |
| 6,864,127 | B2 | 3/2005 | Yamazaki et al. |
| 6,864,522 | B2 | 3/2005 | Krieger et al. |
| 7,026,702 | B2 | 4/2006 | Krieger et al. |
| 7,122,853 | B1 | 10/2006 | Gaun et al. |
| 7,221,599 | B1 | 5/2007 | Gaun et al. |
| 7,254,053 | B2 | 8/2007 | Krieger et al. |
| 7,289,353 | B2 | 10/2007 | Spitzer et al. |
| 2003/0064572 | A1 * | 4/2003 | Johnson ................. G11C 17/16 |
| | | | 438/527 |
| 2004/0012035 | A1 | 1/2004 | Branz et al. |
| 2004/0026682 | A1 | 2/2004 | Jiang |
| 2005/0029587 | A1 | 2/2005 | Harshfield |
| 2006/0028895 | A1 | 2/2006 | Taussig et al. |
| 2007/0008773 | A1 | 1/2007 | Scheuerlein |
| 2007/0015348 | A1 | 1/2007 | Hsu et al. |
| 2008/0025066 | A1 | 1/2008 | Fasoli et al. |
| 2008/0089110 | A1 | 4/2008 | Robinett et al. |
| 2008/0090337 | A1 | 4/2008 | Williams |

OTHER PUBLICATIONS

Stikeman, "Polymer Memory, The plastic path to better data storage", Technology Review Sep. 2002, p. 31.
Office Action for U.S. Appl. No. 11/875,541 dated May 19, 2015, 21 pages.
Office Action for U.S. Appl. No. 11/875,541 dated Jan. 13, 2016, 54 pages.
Office Action for U.S. Appl. No. 11/875,541 dated Jul. 22, 2010, 28 pages.
Office Action for U.S. Appl. No. 11/875,541 dated Mar. 30, 2011, 17 pages.
Office Action for U.S. Appl. No. 11/875,541 dated Oct. 5, 2011, 16 pages.
Office Action for U.S. Appl. No. 11/875,541 dated Jun. 8, 2012, 18 pages.
Office Action for U.S. Appl. No. 11/875,541 dated Mar. 4, 2013, 24 pages.
Office Action for U.S. Appl. No. 11/875,541 dated Aug. 13, 2014, 17 pages.
Technology Review Sep. 2002, p. 31, "Polymer Memory, The plastic path to better data storage".
Office Action for U.S. Appl. No. 11/875,541 dated Jul. 25, 2016, 31 pages.
Dehon, "Array-Based Architecture for FET-Based, Nanoscale Electronics," IEEE Transactions on Nanotechnology, 2003, vol. 2 (1), pp. 23-32.
Goronkin, et al., "High-Performance Emerging Solid-State Memory Technologies," MRS Bulletin, Nov. 2004, pp. 805-813.
Muller, et al., "Status and Outlook of Emerging Nonvolatile Memory Technologies", IEEE, 2004, pp. 567-570.
Owen, et al., "Memory Switching in Amorphous Silicon Devices," Journal of Non-Crystalline Solids, 1983, vol. 50-60 (Pt.2), pp. 1273-1280.

Campbell, "Is There an Immortal Memory?," American Association for the Advancement of Science, 2004, vol. 304 (5667), pp. 62-63.
Lee et al., "Full Integration and Cell Characteristics for 64Mb Nonvolatile PRAM", 2004 Symposium on VLSI Technology Digest of Technical Papers, IEEE, 2004, pp. 20-21.
Chou, et al., "Imprint Lithography With 25-Nanometer Resolution," Science, 1996, vol. 272, pp. 85-87.
Zankovych, et al., "Nanoimprint Lithography: Challenges and Prospects," Nanotechnology, 2001, vol. 12, pp. 91-95.
Avila, et al., "Switching in Coplanar Amorphous Hydrogenated Silicon Devices," Solid-State Electronics, 2000, vol. 44 (1), pp. 17-27.
Hu, et al., "Switching and Filament Formation in hot-wire CVD p-type a-Si:H devices," Thin Solid Films, Science Direct, 2003, vol. 430, pp. 249-252.
Hudgens, et al., "Overview of Phase-Change Chalcogenide Nonvolatile Memory Technology", MRS Bulletin Nov. 2004, pp. 829-832.
Terabe, et al., "Quantized Conductance Atomic Switch," Nature, 2005, vol. 433, pp. 47-50.
Kund, et al., "Conductive Bridging Ram (cbram): An Emerging Non-volatile Memory Technology Scalable to Sub 20nm", IEEE, 2005, pp. 754-757.
Boer, "Threshold switching in hydrogenated amorphous silicon", Appl. Phys. Let. May 1, 1982, vol. 40, No. 9, pp. 812-813.
Le Comber, et al., "The Switching Mechanism in Amorphous Silicon Junctions", Journal of Non-Crystalline Solids 1985, vol. 77 & 78, pp. 1373-1382.
Owen, et al., "Switching in amorphous devices", Int. J. Electronics 1992, vol. 73, No. 5, pp. 897-906.
Jafar, et al., "Switching in amorphous-silicon devices", The American Physical Society, vol. 49, No. 19, 1994, pp. 611-615.
Chen, et al., "Nanoscale molecular-switch crossbar circuits", Nanotechnology 2003, vol. 14, pp. 462-468.
Collier, et al., "Electronically Configurable Molecular-based Logic Gates," Science, 1999, vol. 285 (5426), pp. 391-395.
Gangopadhyay, et al., "Memory Switching in Sputtered Hydrogenated Amorphous Silicon (a-Si:H)," Japanese Journal of Applied Physics, 1985, vol. 24 (10), pp. 1363-1364.
Dey, "Electrothermal model of switching in amorphous silicon films", Sci. Technol. January! Feb. 1980, vol. 17, No. 1, pp. 445-448.
Hajto, et al., "The Programmability of Amorphous Silicon Analogue Memory Elements," Materials Research Society Symposium Proceedings , 1990, vol. 192, pp. 405-410.
Rose, et al., "Amorphous Silicon Analogue Memory Devices," Journal of Non-Crystalline Solids, 1989, vol. 115, pp. 168-170.
Moopenn, et al, "Programmable Synaptic Devices For Electronic Neural Nets," Control and Computers, 1990, vol. 18 (2), pp. 37-41.
Le Comber et al., "Present and future applications of amorphous silicon and its alloys", Journal of Non-Crystalline Solids 1989, vol. 115, pp. 1-13.
Hu, et al., "AC Characteristics of Cr/p. sup.+a-Si:H/V Analog Switching Devices," IEEE Transactions on Electron Devices, 2000, vol. 47 (9), pp. 1751-1757.
Owen et al., "New Amorphous-silicon electrically programmable nonvolatile switching device", IEE Proc. Apr. 1982, vol. 129, Pt. 1, No. 2, p. 51-54.
Hajto, et al., "Analogue Memory and Ballistic Electron Effects in Metal-amorphous Silicon Structures," Philosophical Magazine, 1991, vol. 63 (1), pp. 349-369.
Muller, et al., "The Electronic Structure at the Atomic Scale of Ultrathin Gate Oxides," Nature, 1999, vol. 399, pp. 758-761.
Sune, et al., "Nondestructive Multiple Breakdown Events in Very Thin Si02 Films," Applied Physics Letters, 1989, vol. 55, pp. 128-130.
Owen, et al., "Electronic Switching in Amorphous Silicon Devices: Properties of the Conducting Filament", Proceedings of 5th International Conference on Solid-State and Integrated Circuit Technology, IEEE, 1998, pp. 830-833.
Hu, et al., "Area-Dependent Switching In Thin Film-Silicon Devices", Materials Research Society Symposium Proceedings, 2003, vol. 762, pp. A 18.3.1-A 18.3.6.

(56) References Cited

OTHER PUBLICATIONS

Muller et al., "Status And Outlook Of Emerging Nonvolatile Memory Technologies", IEEE, 2004, pp. 567-570.
Office Action for U.S. Appl. No. 11/875,541 dated Apr. 6, 2017, 30 pages.
Gordon et al., "Conducting Filament of the Programmed Metal Electrode Amorphous Silicon Antifuse", 1993, IEDM, pp. 27-30.
Office Action for U.S. Appl. No. 11/875,541 dated Nov. 30, 2017, 14 pages.

* cited by examiner

NON-VOLATILE SOLID STATE RESISTIVE SWITCHING DEVICES

CROSS-REFERENCE TO RELATED APPLICATIONS

This application is a continuation of U.S. patent application Ser. No. 11/875,541, filed Oct. 19, 2007, which claims the benefit of U.S. Provisional Application Ser. No. 60/853,250, filed Oct. 20, 2006. The complete contents of these prior applications are hereby incorporated by reference.

STATEMENT REGARDING FEDERALLY FUNDED RESEARCH

The invention was made with Government support under CCF0621823 awarded by the National Science Foundation. The Government has certain rights in the invention.

BACKGROUND

The invention relates to non-volatile solid state resistive switching devices.

Resistive switching behavior has been observed and studied in layered amorphous silicon (a-Si) devices since the 1980s. A typical metal/a-Si/metal (M/a-Si/M) layered device consists of two metal layers sandwiching an a-Si layer. The a-Si layer serves as a storage medium.

Resistive switching behavior has been characterized in terms of metal filament formation inside the a-Si matrix at positive applied voltages. M/a-Si/M devices typically have micron sized filaments which may prevent them from being scaled down to the sub-100 nanometer range.

M/a-Si/M devices are formed at high-voltages. For example, a ten volt pulse may be applied to form certain M/a-Si/M devices. Such forming may not be well-controlled and permanent damage may occur after initial filament formation. This damage may severely limit device yield and application potential.

Other non-volatile memory device structures, such as ferroelectric random access memory (RAM), magneto-resistive RAM, organic RAM, phase change RAM and conductive bridging RAM, have been explored as next generation memory devices. These devices, however, include materials that are not compatible with existing CMOS processes thus increasing fabrication costs. These devices may also exhibit slow switching speeds, small on/off resistance ratios and poor thermal stability.

SUMMARY

In accordance with an embodiment of the invention there is provided a resistive switching device that includes a substrate comprising a surface region, a first dielectric material overlying the surface region of the substrate, a bottom electrode comprises a p-doped polysilicon material and overlying the first dielectric material, a second electrode comprising at least a silver material, and a switching material disposed between the first electrode and the second electrode. The switching material comprises an undoped amorphous silicon material, wherein the undoped amorphous silicon material is characterized by a controlled defect density that is associated with a desired on-resistance for the resistive switching device.

In accordance with another embodiment of the invention, there is provided a method for forming a resistive switching device. The method includes the steps of: (a) forming a first dielectric material overlying a surface region of a substrate, (b) forming a plurality of first electrodes overlying the first dielectric material, wherein the plurality of first electrodes comprise metal material and p-doped polysilicon material, and wherein the first electrodes extend in a first direction, (c) depositing an undoped amorphous silicon material over at least a part of the first electrodes under conditions that create a desired on-resistance associated with the undoped amorphous silicon material, and (d) forming a plurality of second electrodes comprising silver material, wherein the second electrodes extend in a second direction that is not parallel to the first direction, and wherein the second electrodes overlie the undoped amorphous silicon material at crossing intersections of the first and second electrodes.

DETAILED DESCRIPTION OF THE ILLUSTRATED EMBODIMENTS

Figure 1:
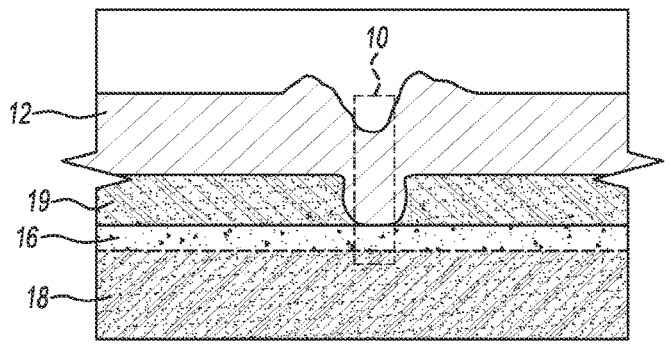
FIG. 1 is a side view, in cross-section, of an active region of an exemplary non-crystalline silicon non-volatile resistive switching device according to certain embodiments of the invention.

The switching and memory devices described below relate to earlier work done on nanoscale metal/amorphous silicon/crystalline silicon (M/a-Si/c-Si) device structures utilizing semiconductor nanowires. We observed two major improvements on the nanoscale M/a-Si/c-Si structure compared to the microscale M2M structures. First, the initial forming process can be eliminated in the M/a-Si/c-Si system. Second, the M/a-Si/c-Si devices can exhibit intrinsic rectification. In the meantime, key memory parameters, comparable to those obtained on microscale M2M planar devices, are maintained in the nanoscale M/a-Si/c-Si devices. Based on knowledge learned in the semiconductor nanowire system, we believe that more reliable, more scalable, nanofabricated crossbar arrays can be realized using the a-Si/c-Si heterostructure technique. These nanofabricated, high-density, scalable arrays will be suitable for next generation computation schemes.

The semiconductor nanowire based a-Si/c-Si devices consist of a p-type crystalline Si (c-Si) nanowire core and an amorphous Si (a-Si) shell, which serves as the active information storage medium. The nanowire core is grown via a catalyst mediated vapor-liquid-solid process inside a chemical vapor deposition (CVD) chamber, such that the diameter of the nanowire is controlled by the size of the catalyst nanoparticle, typically ~20 nm. Nanowires with length over 20 μm and aspect ratios over $10^3$ can be readily grown using this catalyst mediated method. After the c-Si core growth, the a-Si shell is deposited in situ without breaking the vacuum inside the same chamber, through a conventional CVD process treating the c-Si core as a substrate. After growth, the nanowires are transferred to a liquid suspension via gentle sonication, and then deposited on the device substrate. Electrical contacts to the nanowires are normally achieved through e-beam or photo-lithography and metal evaporation. The key difference between the nanowire based M/a-Si/c-Si device structure and previously studied planar M2M structures is that in the M/a-Si/c-Si structure the active a-Si layer is in direct contact with the doped c-Si core, instead being sandwiched by two metal layers. The a-Si/c-Si heterostructure offers a more optimal interface compared to the M2M structure, which in turn results in improved device performance as discussed later. In the nanowire system, the second contact to the a-Si medium is obtained by a lithographically defined Ag metal line, completing the crossbar sandwich structure.

The semiconducting nanowire system, however, suffers several drawbacks that limit its potential for large scale applications. First, using the doped c-Si as the current path and interconnects creates series-resistance. This problem will be even more severe at large scales. Using a second metal layer as interconnects will solve the series resistance problem, but it is not clear how the metal layer can be integrated with the chemically-grown nanowires. Second and more importantly, despite great progress in the field, assembly of the chemically-grown nanowires into large ordered arrays still remains a challenge and it is not clear if these processes will ever be compatible with commercial CMOS technology.

Non-crystalline silicon (nc-Si) non-volatile resistive switching devices have been fabricated and characterized. These switching devices exhibit performance improvements over previous molecule-based switching devices and may be used as nano-scale memory structures that offer terabit density. In some examples, the switching devices include an active non-crystalline silicon layer sandwiched between an electrode and a planar doped silicon electrode. The planar doped silicon electrode may be a p-type silicon (p-Si) electrode. The planar doped silicon electrode may have a resistivity equal to or less than 0.01 Ω·cm. In other examples, the electrodes may be positioned on a same side of the non-crystalline silicon layer. Other configurations are also possible. These switching devices may be fabricated using CMOS processes thus minimizing fabrication costs. The active areas may be defined with electron-beam lithography or other suitable technologies, such as nano-imprint or interference lithography, to minimize size.

Referring to FIG. 1, an exemplary nc-Si non-volatile resistive switching device 10 includes a metal layer (top electrode) 12, a nc-Si layer 16 and a planar p-Si layer (bottom electrode) 18. Due to the highly resistive nc-Si layer 16, the as-fabricated device 10 has a high resistance and negligible current flow between the top electrode 12 and the bottom electrode 18. A silicon dioxide ($SiO_2$) layer 19 insulates the top electrode 12 from the nc-Si layer 16 outside the active region of the device 10. The active region of the device 10 is approximately 2500 $nm^2$. In other examples, the active region of the device 10 may be less than or greater than 2500 $nm^2$. The thickness of the nc-Si layer 16 is approximately 50 nm. The thickness of each of the electrodes is approximately 80 nm. Other thicknesses are also possible. As an example, the thickness of the nc-Si layer my be approximately 60 nm. The thickness of each of the electrodes may be approximately 100 nm.

In the example of FIG. 1, the top electrode 12 comprises silver (Ag) and the nc-Si layer 16 comprises undoped amorphous silicon prepared via plasma enhanced chemical vapor deposition (PECVD). In other examples, the top electrode 12 may comprise gold (Au), nickel (Ni), aluminum (Al), chromium (Cr), iron (Fe), manganese (Mn), tungsten (W), vanadium (V), cobalt (Co) or any other suitable metal. The nc-Si layer 16 may comprise undoped amorphous-poly silicon prepared via low pressure chemical vapor deposition (LPCVD) or amorphous silicon prepared via sputtering or thermal chemical vapor deposition. The bottom electrode 18 may comprise a p-type single-crystalline silicon or polysilicon. A metal may be positioned adjacent to the bottom electrode 18 to reduce the resistance presented to the nc-Si layer 16. Other configurations and material combinations are also possible.

nc-Si non-volatile resistive switching devices may be fabricated using existing CMOS technologies. In an exemplary process, a mixture of silane ($SiH_4$) (45 sccm) and Helium (He) (500 sccm) is used to form an a-Si layer with a deposition rate of 80 nm per minute (T=260° C., P=600 mTorr) during PECVD. In another exemplary process, silane ($SiH_4$) (80 sccm) is used to form an a-Si layer with a deposition rate of 2.8 nm per minute (T=585° C., P=100 mTorr) during LPCVD. Portions of poly-silicon grains may form during the LPCVD process and result in an amorphous-poly silicon film. The a-Si and amorphous-poly silicon are referred to herein as nc-Si. Following nc-Si fabrication, silicon oxide may be deposited via PECVD and then coated with polymethyl methacrylate (PMMA). E-beam lithography and reactive ion etching (RIE) processes may be used to create windows in the oxide layer and define the active device area. A second e-beam lithography or photo-lithography process may then be performed to pattern the top electrode. Nano-imprint lithography or interference lithography may also be used.

Qualitative switching device characteristics may be independent of the fabrication process whereas quantitative switching device characteristics may be dependent on the fabrication process. For example, higher deposition temperatures and Hydrogen ($H_2$) concentrations typically associated with LPCVD processes may cause higher defect densities, which in turn may result in tightly spaced metal islands after filament formation and lower on-resistances compared to PECVD processes.

More than 40 batches of nc-Si non-volatile resistive switching devices were fabricated using techniques similar to or the same as those described above. Switching devices of varying active area size were examined. The devices were measured using a probe station. An ad-hoc measurement system or a commercial semiconductor parameter analyzer was used for DC characterizations. An arbitrary function generator and digital oscilloscope was used in switching speed measurements.

Figure 2:
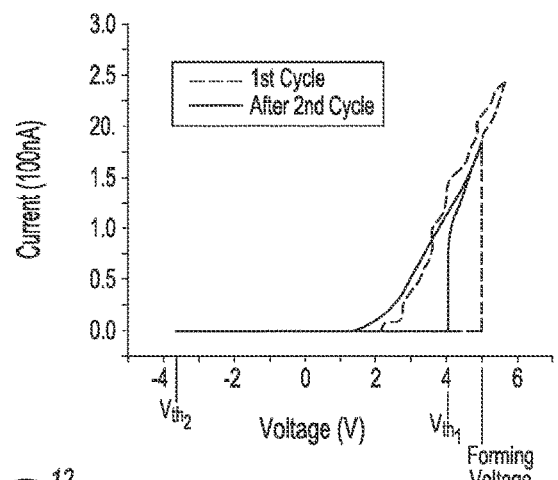
FIG. 2 is an exemplary plot of resistive switching characteristics of the switching device of FIG. 1.
Figure 12:
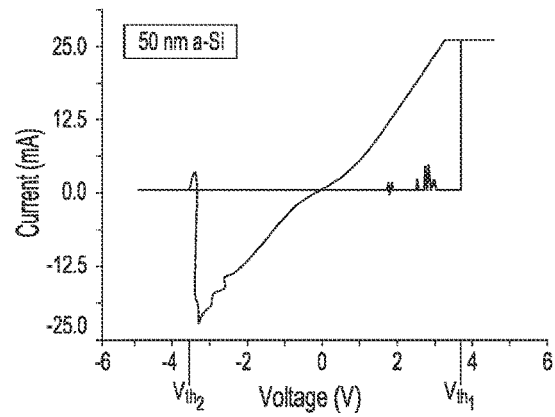
Figure 13:
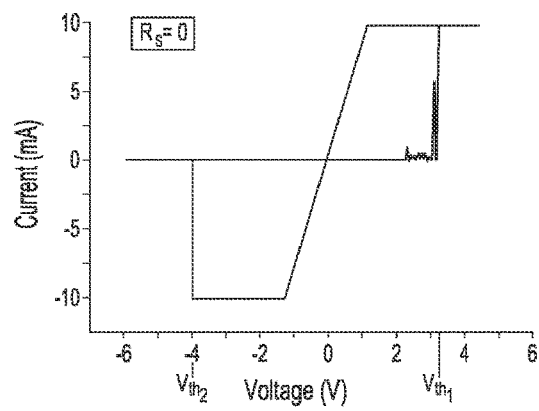

Repeatable resistive switching behaviors were observed as a voltage, V, was applied (and varied) between the electrodes of the devices. Referring to FIGS. 2, 12 and 13, the devices were switched from a high resistance state, i.e., off, to a low resistance state, i.e., on, when V was increased beyond a certain threshold voltage, $V_{th1}$. The devices were also switched from the low resistance state to the high resistance state, i.e., off, when V was decreased beyond a certain threshold voltage, $V_{th2}$. When V was between $V_{th1}$ and $V_{th2}$, the states of the devices were not affected. Such intermediate voltages were used to read the on/off states of the devices. Additionally, when V was removed, the states of the devices were not affected. The threshold voltages may be dependent on the metal used for the top electrode and the fabrication method used for the nc-Si layer.

The threshold voltages may be narrowly distributed for a specific set of device parameters. As an example, the threshold voltage, $V_{th1}$, may be centered at 3.5 V (±0.5 V) for a device having a Ag top electrode and a nc-Si layer prepared via PECVD, such as device 10. As another example, the threshold voltage, $V_{th1}$, may be centered at 7 V (±0.5 V) for a device having a Au top electrode and a nc-Si layer prepared via PECVD.

Unlike phase-change memory devices and conductive-bridge memory devices, nc-Si non-volatile resistive switching devices are polarity dependent and insensitive to electrode material. For example, switching device 10 may be written with a positive voltage and erased with a negative voltage but not visa versa. This suggests that the observed resistive switching behavior is caused by a filament formation process.

Figure 3A:
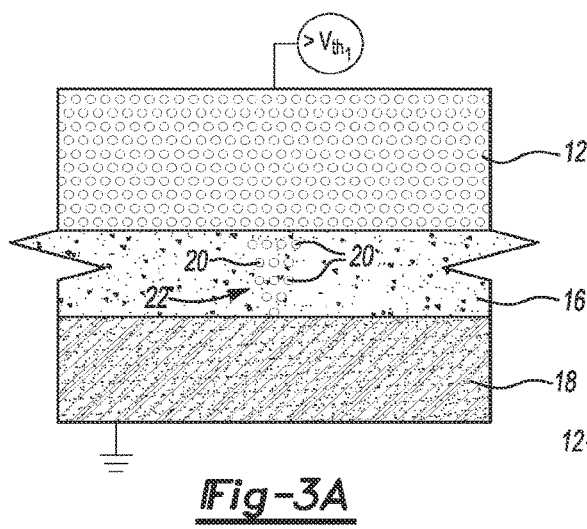
FIGS. 3A-3B are enlarged side views, in cross-section, of a portion of the switching device of FIG. 1.

Referring to FIG. 3A, a positive voltage (with a magnitude greater than $V_{th1}$) applied to the top electrode 12 generates electric fields that drive metal, e.g., Ag, ions 20 into the nc-Si layer 16 thus forming a conducting filament 22 inside the nc-Si layer 16. The metal filament 22 creates a pathway for electrons from the top electrode 12 to the bottom electrode 18 and results in an on-resistance, $R_{on}$, that is lower than an off-resistance, $R_{off}$.

$R_{off}$ is comparable to as-fabricated devices while $R_{on}$ is several orders of magnitude lower. The resistance ratio, $R_{off}/R_{on}$, may range from $10^3$ to $10^7$. The resistance ratio, however, may depend on the technique used to fabricate the nc-Si layer 16, e.g., PECVD versus LPCVD, and growth conditions.

Figure 3B:
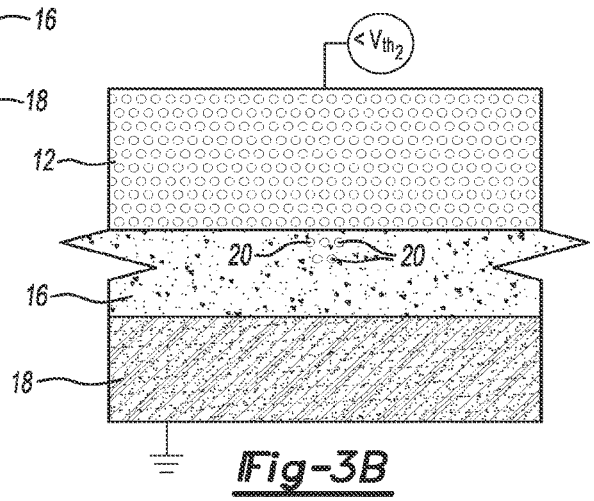

Referring to FIG. 3B, a negative voltage (with a magnitude greater than $V_{th2}$) applied to the top electrode 12 generates electric fields that pull the Ag ions 20 from the nc-Si layer 16. The metal filament 22 is not affected at intermediate voltages or when the voltage source is removed, thus ensuring non-volatile operation.

nc-Si non-volatile resistive switching devices, such as device 10, do not require high-voltage forming. Referring to FIG. 2, the 1$^{st}$ cycle write voltage is only slightly higher than the after 2$^{nd}$ cycle write voltage. Once formed, $V_{th1}$ and $V_{th2}$ show little dependence on the number of write/erase cycles.

The reduced forming voltage may be partly explained by the fact that high-electrical fields can be readily generated inside nc-Si layers because nc-Si non-volatile resistive switching devices effectively form reverse-biased Schottky junctions at positive bias. This may limit damage due to heating and electro-migration after filament formation and improve device yield. Thinner nc-Si films compared to conventional M/a-Si/M structures may also help reduce the forming voltage.

The elimination of high voltage forming increases device yield compared to conventional M/a-Si/M structures. For example, examination of over three hundred nc-Si non-volatile resistive switching devices resulted in a yield of greater than 99%. As a comparison, examination of conventional M/a-Si/M devices resulted in a yield of less than 40%.

nc-Si non-volatile resistive switching devices are suitable for ultra-high density memory applications. For example, devices with active areas ranging from $11 \times 10^3$ μm$^2$ to $2.5 \times 10^{-3}$ μm$^2$ showed no sign of device degradation when tested.

Figure 4:
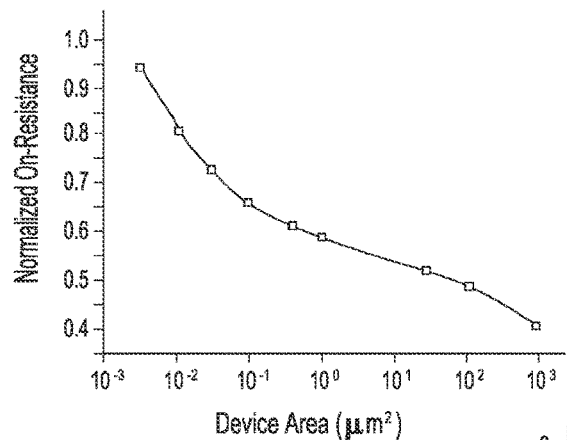
FIG. 4 is an exemplary plot of normalized on-resistance versus device area for non-crystalline silicon non-volatile resistive switching devices according to certain embodiments of the invention.

Referring to FIG. 4, the normalized $R_{on}$ of nc-Si non-volatile resistive switching devices increased about 2.5 times as the active area decreased by 6 orders of magnitude. This is in contrast to conventional M/a-Si/M devices in which switching currents may scale linearly with device area. The relationship between normalized $R_{on}$ and device area of FIG. 4 suggests that the formation of a first conducting filament in a nc-Si non-volatile resistive switching device, combined with series resistances at the contacts or in the p-Si layer, reduces the electric field across the nc-Si layer and prevents other filaments from fully forming.

Figure 5:
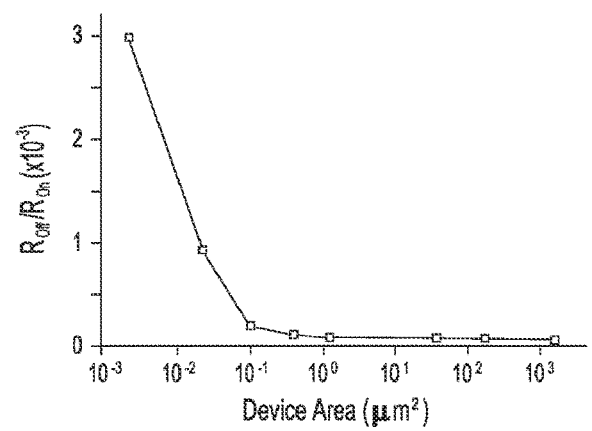
FIG. 5 is an exemplary plot of resistance ratio versus device area for non-crystalline silicon non-volatile resistive switching devices according to certain embodiments of the invention.

Referring to FIG. 5, $R_{off}/R_{on}$ increased in nc-Si non-volatile resistive switching devices as device area decreased because $R_{off}$ is limited by direct tunneling and inversely proportional to device area. The continued improvement of $R_{off}/R_{on}$ at the smallest device scales indicates that the minimal working device size may be limited by the top electrode size rather than the conducting filament size. In the examples discussed herein, the top electrode sizes were limited by the e-beam lithography and RIE fabrication processes. Devices with areas smaller than 2500 nm$^2$, however, should still be operational with improved fabrication techniques.

Filament sizes on the order of micrometers and device sizes limited to several micrometers were observed in previous studies of M/a-Si/M structures. The relatively low forming voltages and thin nc-Si layers in nc-Si non-volatile resistive switching devices likely results in reduced filament, and thus device, sizes.

The speed, retention and endurance of 50 nm×50 nm nc-Si non-volatile resistive switching devices having Ag electrodes and nc-Si layers prepared using PECVD or LPCVD were tested. Device states were read at a low applied voltage by measuring the voltage across a series sensing resistor, while short voltage pulses were used to write and erase.

Figure 6A:
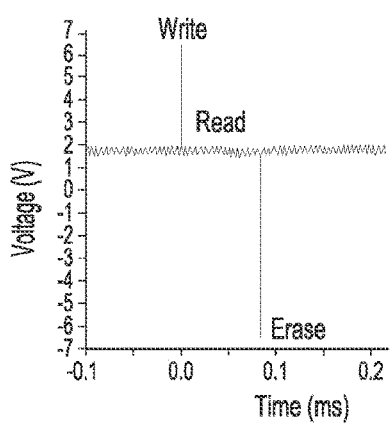
FIG. 6A is an exemplary plot of write, read and erase voltages versus time used to write, read and erase information from non-crystalline silicon non-volatile resistive switching devices according to certain embodiments of the invention.

Referring to FIG. 6A, an exemplary write/read/erase sequence for a nc-Si non-volatile resistive switching device includes a 5 ns write pulse at 6.5 V, a 1.5 V read voltage and a 5 ns erase pulse at −6.5 V.

Figure 6B:
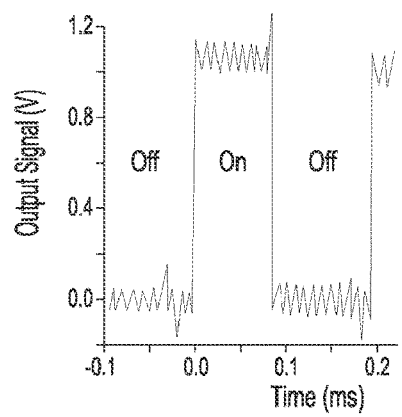
FIG. 6B is an exemplary plot of output signal voltages for the switching devices referenced with respect to FIG. 6A corresponding to the write, read and erase voltages of FIG. 6A.

Referring to FIG. 6B, a corresponding output signal to the sequence of FIG. 6A includes a series of high and low output voltages. The devices were off at the beginning of the sequence. The voltage measured across the sensing resistors, which corresponds to the current through the devices, was low. The devices were turned on when the write pulse was supplied. A higher sensing voltage was recorded in the following read period. The erase pulse turned the devices off and the cycle was repeated.

Switching speeds faster than 5 ns were obtained for LPCVD prepared devices having an $R_{on}$ less than 200Ω. These speeds are several orders of magnitude faster than those reported for molecular devices. These speeds are also comparable to or better than the best values reported for other emerging memory devices. Switching speeds of approximately 150 ns were obtained for PECVD prepared devices having an $R_{on}$ greater than 1 MΩ. The switching speeds of PECVD devices may be improved by reducing $R_{on}$ through the adjustment of the growth conditions or by reducing the parasitic capacitance to reduce the RC delay in the circuit.

Figure 7:
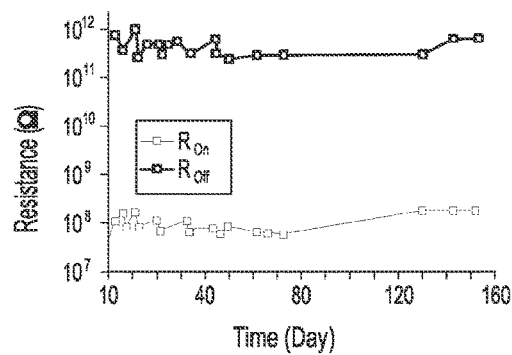
FIG. 7 is an exemplary plot of resistance versus time for the switching devices referenced with respect to FIG. 6A.

Referring to FIG. 7, retention testing revealed that the information stored in the devices can be preserved for at least 150 days at room temperature in ambient air without power or refreshing.

Figure 8:
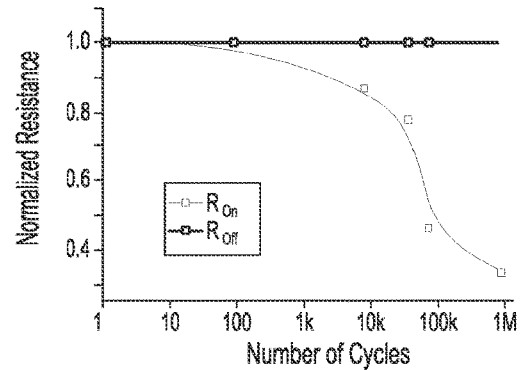
FIG. 8 is an exemplary plot of normalized resistance versus number of cycles for the switching devices referenced with respect to FIG. 6A.

Endurance testing was performed on various types of nc-Si non-volatile resistive switching devices. Referring to FIG. 8, as the number of write and erase cycles increased, the on-current increased and the on-write voltage decreased. The magnitude of $R_{off}$ was larger than the equipment limit and no change was observed. If the erase time or the erase voltage was temporarily increased, the as-fabricated deviated threshold voltage and $R_{off}/R_{on}$ were recovered.

Figure 9:
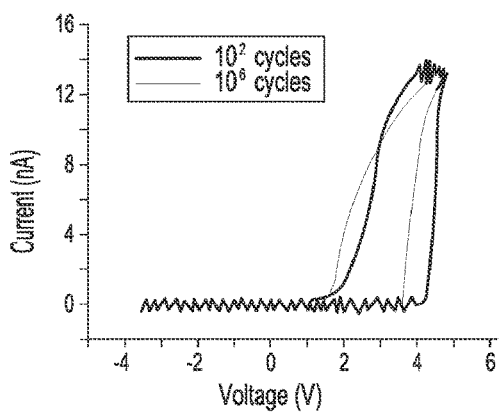
FIG. 9 is an exemplary plot of current versus voltage for the switching devices referenced with respect to FIG. 6A.

Referring to FIG. 9, reliable switching persisted in the devices after $10^6$ programming cycles, which is comparable to flash memory devices. The endurance, however, was generally less robust when the programming current was high. For example, $R_{off}/R_{on}$ started to reduce after $10^5$ cycles and became ~10 after $4 \times 10^5$ cycles for a device with a write programming current of 10 mA. This decrease in $R_{off}/R_{on}$ was mainly caused by the increase in off-current, and may be explained by metal ions semi-permanently residing inside the nc-Si matrix after repeated application of large drive currents.

Figure 10:
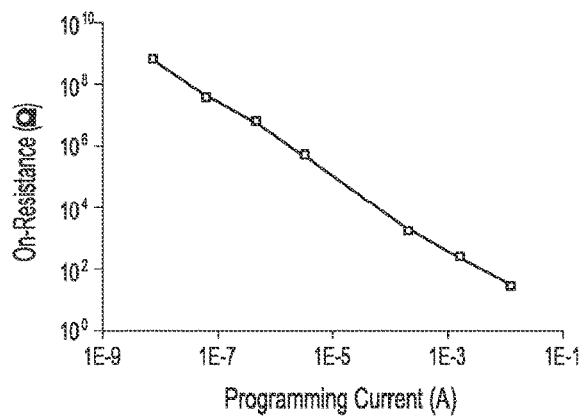
FIG. 10 is an exemplary plot of on-resistance versus programming current for the switching devices referenced with respect to FIG. 6A.

The multi-level bit capability of a memory device increases storage density and functionality. Such capabilities of nc-Si non-volatile resistive switching devices were tested. The maximum programming current during the write processes was controlled using a series resistor. Referring to FIG. 10, a series of values for $R_{on}$ were obtained in a single device by controlling the programming current. The different values for $R_{on}$ may be assigned to different bits hence demonstrating the multi-level bit capability of nc-Si non-volatile resistive switching devices.

Figure 11:
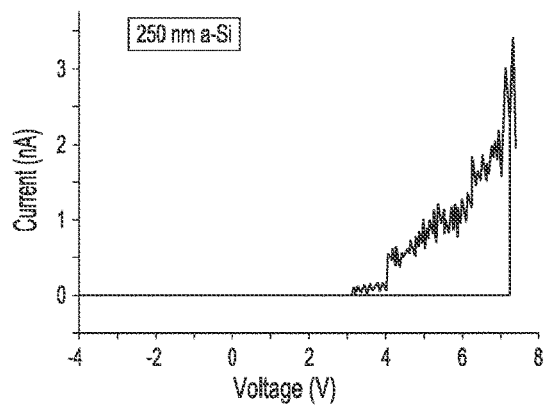
FIGS. 11-14 are exemplary plots of current versus voltage for non-crystalline silicon non-volatile resistive switching devices according to certain embodiments of the invention.

Rectifying (diode-like) and non-rectifying (resistor-like) switching behavior may be obtained in nc-Si non-volatile resistive switching devices. Referring to FIG. 11, some nc-Si non-volatile resistive switching devices having 250 nm thick a-Si layers, in the on-state, exhibit higher current levels at a positive bias compared to that at a negative bias when the bias is less than $V_{th2}$, i.e., the devices in the on-state behave like diodes. This rectifying behavior may be beneficial to the elimination of crosstalk in crossbar devices and has not been observed in other memory technologies.

Referring to FIG. 12, other nc-Si non-volatile resistive switching devices having 50 nm thick a-si layers, in the on-state, exhibit symmetric current-voltage curves, i.e., the devices in the on-state behave like resistors.

Generally, devices having nc-Si layers prepared via PECVD exhibited rectifying switching behavior. Devices having nc-Si layers prepared via LPCVD exhibited non-rectifying behavior. These different behaviors correlate with the different write currents in the two types of devices as $R_{on}$ is much higher (and hence write currents are much lower) in PECVD prepared devices compared to that of LPCVD prepared devices. For example, if the on-current was greater than ~10 µA (measured at $V_{th1}$ for 50 nm×50 nm devices), the switching characteristics exhibited non-rectifying behavior. If the on-current was less than ~10 µA (measured at $V_{th1}$ for 50 nm×50 nm devices), the switching characteristics exhibited rectifying behavior.

Figure 14:
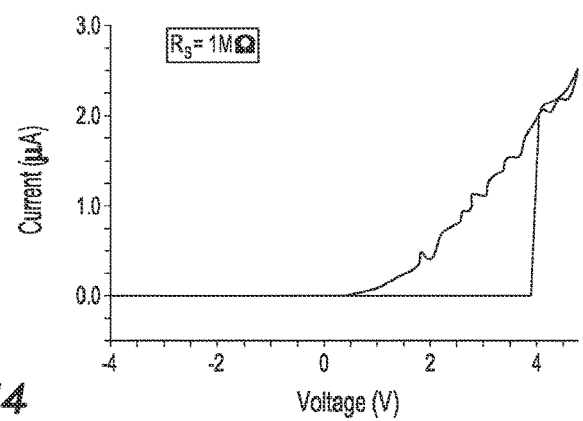

By adjusting the thickness of the nc-Si layer during LPCVD growth, $R_{on}$ (and hence the behavior of the device) may be altered. For example, as the thickness of the nc-Si layer increased, the behavior transitioned from non-rectifying, as shown in FIG. 12, to rectifying, as shown in FIG. 11. Furthermore, rectifying behavior can be obtained on existing low-$R_{on}$ LPCVD devices by positioning a resistor, $R_s$, in series with the device as demonstrated in FIGS. 13 and 14. In the example of FIG. 13, the series resistor had an effective resistance of 0Ω. In the example of FIG. 14, the series resistor had an effective resistance of 1 MΩ. The non-rectifying behavior, like the retention dependence, may be related to permanent changes in the nc-Si matrix at large write currents.

Figure 15:
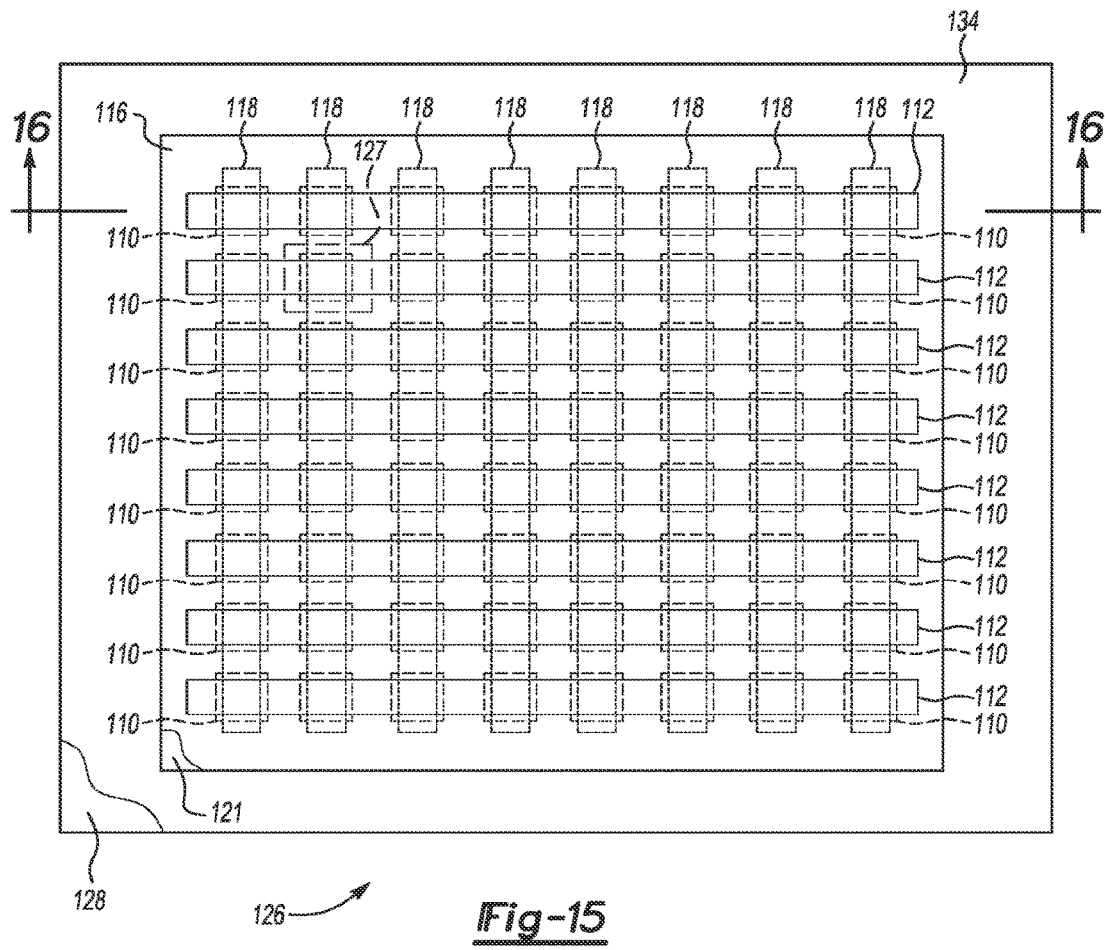
FIG. 15 is a plan view, partially broken away, of an exemplary memory device according to certain embodiments of the invention.

The large range of $R_{on}$ that may be obtained in nc-Si non-volatile resistive switching devices permits the tuning of device parameters to suit specific requirements. For example, high-resistance PECVD devices exhibit rectifying on-state behaviors, ultra-low write currents and ultra-low power consumption with excellent retention and endurance. Low resistance LPCVD devices exhibit faster speeds with compromises in write current and endurance.

nc-Si nonvolatile resistive switching devices may be used to form ultra-high density memory devices. Referring to FIG. 15, a memory device 126 includes a substrate 128, e.g., silicon, glass, etc., metal electrodes 112, a nc-Si layer 116 and p-Si electrodes 118. Numbered elements of FIG. 15 differing by 100 relative to numbered elements of FIG. 1 have similar, although not necessarily identical, descriptions to the numbered elements of FIG. 1. The electrodes 112, 118 form a crossbar structure. nc-Si non-volatile resistive switching devices 110 are formed at intersections of the crossbar structure. A cell size 127 for the devices 110 is approximately 0.003 µm². In other examples, the cell size 127 may be less than 0.003 µm² or less than or equal to 0.01 µm².

Figure 16:
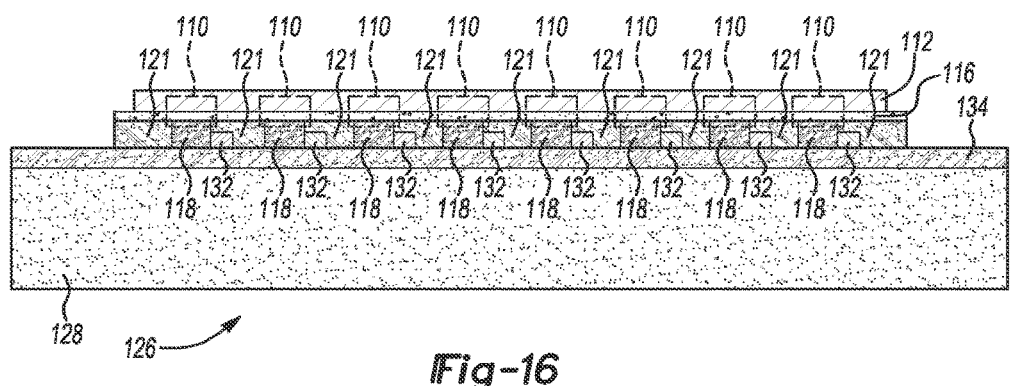
FIG. 16 is a side view, in cross-section, of the memory device of FIG. 15 taken along line 16-16 of FIG. 15.

Referring to FIG. 16, the p-Si electrodes 118 are separated by a insulative dielectric, e.g., $SiO_2$, 121. Metal lines 132, e.g., Cu, are positioned adjacent to the bottom electrodes 118 to reduce the resistance presented to the nc-Si layer 116. The p-Si electrodes 118, insulative dielectric 121 and metal lines 132 sit on top of an insulative layer, e.g., $SiO_2$, 134. The insulative layer 134, p-Si electrodes 118, insulative dielectric 121, metal lines 132, nc-Si layer 116 and metal electrodes 112 may be repeated to form a three-dimensional, multiple layer structure to further increase the memory density. Other configurations and materials may also be used.

Several methods may be used to fabricate memory devices similar to the exemplary memory device 126. As an example, such a memory device may be fabricated on commercially available silicon-on-insulator (SOI) wafers in which parallel lines are etched in a p-Si layer to form p-Si electrodes. These p-Si electrodes are in turn isolated from a substrate by an insulator, e.g. $SiO_2$. As another example, p-Si (crystalline or polycrystalline) electrodes can be deposited on top of a $SiO_2$ layer through lithography and deposition processes. As yet another example, a p-Si (crystalline or polycrystalline) layer can be deposited or grown on top of a SiO$_2$ layer. The p-Si layer is then etched to form p-Si electrodes. As still yet another example, an array of parallel p-Si lines are formed through e-beam lithography (or interference lithography or nanoimprint lithography) starting from an SOI wafer. Side metal electrodes can be deposited from an angled-evaporation process, using the p-Si lines as a self-aligned mask. Excess metal can be removed with reactive-ion etching from a different angle compared to the previous evaporation angle. The sample can then go through a planarization process. This ensures that high-quality nanoscale metal electrodes can be obtained using the above-mentioned lithography methods and prevents nc-Si from depositing on the sidewalls of the p-Si lines that may result in device fluctuation and crosslinking between neighboring devices.

Several techniques may be used during the planarization process. As an example, an insulator including SiO$_2$ and spin-on dielectrics with low dielectric constants may be first deposited to fill the gaps of the p-Si lines, followed by Chemical Mechanical Polishing (CMP) to create a flat surface and expose only the top surface of the p-Si lines. The surface may then be cleaned and the nc-Si layer deposited. In the final step, a second lithography process is performed and the top electrodes are patterned after evaporation and liftoff processes to complete the crossbar memory array structure. Other fabrication techniques may also be used.

The exemplary crossbar memory device 126 may be connected to other electrical components to form a complete circuit. Each crosspoint (bit) in the memory 126 may be accessed through address multiplexers and demultiplexers connected to the columns and rows forming the crossbar array. The bits may be read, written or erased one at a time or a group at a time.

nc-Si non-volatile resistive switching devices may also be used in other non-crossbar based memories or logic applications, for example, as radiation-hard memories or reconfigurable interconnects (switches) between different logic or memory devices. An array of these switches may be used to form a field programmable logic array. Other configurations are also possible.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

The invention claimed is:

1. A resistive switching device comprising:
   a substrate comprising a surface region;
   a first dielectric material overlying the surface region of the substrate;
   a first electrode overlying the first dielectric material, wherein the first electrode comprises a p-doped polysilicon material;
   a second electrode comprising at least an aluminum material; and
   a switching material disposed between the first electrode and the second electrode, the switching material comprising an undoped amorphous silicon material, wherein the undoped amorphous silicon material is characterized by a controlled defect density that is associated with a desired on-resistance for the resistive switching device; wherein the switching material is disposed adjacent to and in contact with the aluminum material.

2. The device of claim 1 wherein the resistive switching device is configured to have three or more non-volatile resistance states.

3. The device of claim 1 wherein the switching device comprises a non-volatile solid state resistive switch device produced using chemical vapor deposition, and wherein the controlled defect density associated with the undoped amorphous silicon material is a deposition temperature-dependent defect density produced during device fabrication based at least in part on a selected deposition temperature used during deposition of the undoped amorphous silicon material.

4. The device of claim 1 wherein the switching device comprises a non-volatile solid state resistive switch device produced using chemical vapor deposition, and wherein the controlled defect density associated with the undoped amorphous silicon material is a Hydrogen concentration-dependent defect density produced during device fabrication based at least in part on a selected Hydrogen concentration used during deposition of the undoped amorphous silicon material.

5. The device of claim 1 wherein a filament is removably disposed in a portion of the switching material, wherein the filament comprises a plurality of aluminum particles from the aluminum material.

6. The device of claim 5 wherein a voltage causes a resistance of the resistive switching device to change to the desired on-resistance.

7. The device of claim 1 wherein the undoped amorphous silicon material comprises undoped LPCVD amorphous silicon material.

8. The device of claim 1, wherein the first and second electrodes and the switching material together comprise a non-volatile switching device supported by the substrate.

9. The device of claim 8, wherein the switching material is configured to have a filament removably disposed therein, wherein the filament comprises a plurality of aluminum particles from the aluminum material.

10. A memory device comprising a plurality of non-volatile switching devices of claim 8, wherein the plurality of non-volatile switching devices are all carried by the substrate.

11. A memory device comprising:
    a substrate comprising a surface region;
    a first dielectric material overlying the surface region of the substrate;
    a first plurality of electrodes overlying the first dielectric material, wherein the first plurality of electrodes comprise a metal material and a conductive material, wherein the conductive material has a resistance higher than the metal material;
    a second plurality of electrodes comprising at least an aluminum material; and
    a switching material disposed between intersections of the first plurality of electrodes and the second plurality of electrodes, wherein the switching material comprising a silicon material substantially free of p-type dopants, and further wherein the silicon material is characterized by a controlled defect density that is associated with a desired on-resistance for a resistive switching device;
    wherein the switching material is adjacent to and in contact with the aluminum material and the conductive material, and wherein a filament is removably disposed in a portion of the switching material, wherein the filament comprises a plurality of aluminum particles from the aluminum material.

12. The device of claim 11 wherein the resistive switching device is configured to have three or more non-volatile resistance states.

13. The device of claim 11 wherein a resistivity of the conductive material is lower than about 0.01 Ω·cm.

14. The device of claim 11 wherein the filament is removably disposed within the silicon material.

15. The device of claim 11 wherein the silicon material includes a plurality of defects and is characterized by a defect density.

16. The device of claim 15, wherein the plurality of aluminum particles are removably disposed within defects from the plurality of defects.

17. The device of claim 11, wherein the conductive material comprises p-doped polysilicon material.

18. The device of claim 11 wherein the first plurality of electrodes, the second plurality of electrodes, and the switching material are configured in a crossbar structure.

19. The device of claim 11 wherein the metal material of the first plurality of electrodes comprises copper.

* * * * *